(12) United States Patent
Kim et al.

(10) Patent No.: US 11,021,634 B2
(45) Date of Patent: Jun. 1, 2021

(54) ADHESIVE FILM, PREPARATION METHOD OF SEMICONDUCTOR DEVICE, AND SEMICONDUCTOR DEVICE

(71) Applicant: LG CHEM, LTD., Seoul (KR)

(72) Inventors: Jung Hak Kim, Daejeon (KR); Hee Jung Kim, Daejeon (KR); Se Ra Kim, Daejeon (KR); Kwang Joo Lee, Daejeon (KR); Young Kook Kim, Daejeon (KR); Seung Hee Nam, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/571,210

(22) PCT Filed: Sep. 23, 2016

(86) PCT No.: PCT/KR2016/010692
§ 371 (c)(1),
(2) Date: Nov. 1, 2017

(87) PCT Pub. No.: WO2017/052289
PCT Pub. Date: Mar. 30, 2017

(65) Prior Publication Data
US 2018/0265758 A1    Sep. 20, 2018

(30) Foreign Application Priority Data
Sep. 23, 2015    (KR) .................. 10-2015-0134715

(51) Int. Cl.
| | | |
|---|---|---|
| *C09J 163/10* | (2006.01) | |
| *C09J 7/10* | (2018.01) | |
| *C09J 133/04* | (2006.01) | |
| *C08G 59/62* | (2006.01) | |
| *H01L 25/07* | (2006.01) | |
| *H01L 25/065* | (2006.01) | |
| *H01L 23/482* | (2006.01) | |

(Continued)

(52) U.S. Cl.
CPC .............. *C09J 7/10* (2018.01); *C08G 59/621* (2013.01); *C09J 133/04* (2013.01); *C09J 163/00* (2013.01); *C09J 163/10* (2013.01); *H01L 23/482* (2013.01); *H01L 24/27* (2013.01); *H01L 24/29* (2013.01); *H01L 24/32* (2013.01); *H01L 24/73* (2013.01); *H01L 24/83* (2013.01); *H01L 24/91* (2013.01); *H01L 25/065* (2013.01); *H01L 25/07* (2013.01); *C09J 2203/326* (2013.01); *C09J 2301/312* (2020.08); *C09J 2433/00* (2013.01); *C09J 2463/00* (2013.01); *H01L 2224/32225* (2013.01); *H01L 2224/32245* (2013.01); *H01L 2224/45124* (2013.01); *H01L 2224/45144* (2013.01); *H01L 2224/45147* (2013.01); *H01L 2224/83203* (2013.01);

(Continued)

(58) Field of Classification Search
CPC ..... H01L 25/0657; H01L 24/83; H01L 24/91; H01L 24/27; H01L 24/73; H01L 24/32; H01L 2924/0665; H01L 2924/0635; H01L 2224/83203; H01L 2224/32245; H01L 2224/45124; H01L 2224/45147; H01L 2224/32225; H01L 24/29; H01L 25/07; H01L 25/065; H01L 23/482; H01L 2924/3511; H01L 2224/45144; H01L 2224/13139; H01L 2224/13147; H01L 2224/13144; H01L 2224/13118; H01L 2224/29386; H01L 2224/13116; H01L 2224/13113; H01L 2224/2929; H01L 2224/13111; H01L 25/18; H01L 2225/06568; H01L 2224/73204; H01L 24/92; H01L 24/13; H01L 24/81; H01L 24/85; H01L 2224/92125; H01L 2224/92247; H01L 2224/81203; H01L 2224/85207; H01L 2224/83856; H01L 2224/83862; H01L 2924/181; H01L 24/45; H01L 2224/73265; H01L 2224/8388; H01L 2224/33145; H01L 2224/83101; C09J 163/10; C09J 7/10; C09J 133/04; C09J 163/00; C09J 2301/312; C09J 2433/00; C09J 2203/326; C09J 2463/00; C08G 59/621
See application file for complete search history.

(56) References Cited

U.S. PATENT DOCUMENTS 3,021,234 A * 2/1962 Casement .............. C08G 59/42
427/58
5,403,389 A    4/1995 Dershem
(Continued)

FOREIGN PATENT DOCUMENTS

CN    103098192 A    5/2013
JP    11236536 A *    8/1999
(Continued)

OTHER PUBLICATIONS

International Search Report and Written Opinion issued for International Application No. PCT/KR2016/010692 dated Jan. 10, 2017, 12 pages.

*Primary Examiner* — Ermias T Woldegeorgis
(74) *Attorney, Agent, or Firm* — Rothwell, Figg, Ernst & Manbeck, P.C.

(57) ABSTRACT

The present invention relates to an adhesive film having a thixotropic index at 110° C. of 1.5 to 7.5, which is used for fixing a first semiconductor device and a second semiconductor device, a ratio of an area of said first semiconductor device to an area of said second semiconductor device being 0.65 or less, a method for preparing a semiconductor device using the adhesive film, and a semiconductor device.

13 Claims, No Drawings

(51) Int. Cl.
*H01L 23/00* (2006.01)
*C09J 163/00* (2006.01)

(52) U.S. Cl.
CPC ............... *H01L 2924/0635* (2013.01); *H01L 2924/0665* (2013.01); *H01L 2924/3511* (2013.01)

(56) References Cited

U.S. PATENT DOCUMENTS

| | | | |
|---|---|---|---|
| 6,410,630 B1* | 6/2002 | Hoover | C09D 127/12 524/365 |
| 6,699,928 B2 | 3/2004 | Cobbley et al. | |
| 2002/0102769 A1* | 8/2002 | Shibue | H01L 24/32 438/108 |
| 2007/0290369 A1 | 12/2007 | Hasegawa et al. | |
| 2008/0029869 A1 | 2/2008 | Kwon et al. | |
| 2009/0155569 A1* | 6/2009 | Yamaguchi | C09J 7/29 428/323 |
| 2009/0321921 A1* | 12/2009 | Hwang | H01L 25/50 257/701 |
| 2010/0044852 A1 | 2/2010 | Kwon et al. | |
| 2010/0052130 A1 | 3/2010 | Hwang et al. | |
| 2011/0152394 A1 | 6/2011 | Pyun et al. | |
| 2011/0316172 A1 | 12/2011 | Igarashi et al. | |
| 2013/0237018 A1 | 9/2013 | Dilao et al. | |
| 2014/0001654 A1 | 1/2014 | Shishido et al. | |
| 2014/0194555 A1 | 7/2014 | Lee et al. | |
| 2014/0284780 A1 | 9/2014 | Kinoshita | |

FOREIGN PATENT DOCUMENTS

| | | | |
|---|---|---|---|
| JP | 2007-051272 A | 3/2007 | |
| JP | 2008-074928 A | 4/2008 | |
| JP | 2009-177003 A | 8/2009 | |
| JP | 2011-165716 A | 8/2011 | |
| JP | 2011-193009 A | 9/2011 | |
| JP | 2012-015142 A | 1/2012 | |
| JP | 2012-099799 A | 5/2012 | |
| JP | 2012099799 A * | 5/2012 | ............ H01L 24/29 |
| JP | 2012099799 A * | 5/2012 | ......... H01L 23/3128 |
| KR | 10-0809693 B1 | 3/2008 | |
| KR | 10-2009-0056570 A | 6/2009 | |
| KR | 10-2010-0028422 A | 3/2010 | |
| KR | 10-2011-0050561 A | 5/2011 | |
| KR | 10-1045262 B1 | 6/2011 | |
| KR | 10-1237587 B1 | 2/2013 | |
| KR | 10-2014-0001768 A | 1/2014 | |
| KR | 10-1375297 B1 | 3/2014 | |
| KR | 10-2014-0117285 A | 10/2014 | |

\* cited by examiner

ADHESIVE FILM, PREPARATION METHOD OF SEMICONDUCTOR DEVICE, AND SEMICONDUCTOR DEVICE

CROSS-REFERENCE TO RELATED APPLICATION(S)

This application is a 35 U.S.C. 371 National Phase Entry Application from PCT/KR2016/010692, filed Sep. 23, 2016, which claims the benefit of Korean Patent Application No. 10-2015-0134715 filed on Sep. 23, 2015 with the Korean Intellectual Property Office, the disclosure of which is herein incorporated by reference in its entirety.

TECHNICAL FIELD

The present invention relates to an adhesive film, a method for preparing a semiconductor device, and a semiconductor device.

BACKGROUND OF ART

Recently, with an increasing tendency toward miniaturization, high performance, and large capacity of electronic devices, a demand for high density, highly integrated semiconductor packages has been rapidly increasing, and thus the size of semiconductor chips is increasingly becoming larger, and in order to improve the degree of integration, a stack package method of stacking chips in multistages is increasingly used.

As the stack package method, a wire bonding method wherein the electrode part of a semiconductor pellet and the conductor layer installed on a lead frame or stem are connected by a metal wire such as gold or aluminum and so on, or a flip chip method wherein, when a semiconductor chip is attached to a circuit board, it is welded as it is using the electrode pattern on the lower side of the chip without using an additional connection structure such as a metal lead (wire) or an intermediate medium such as a ball grid array (BGA) and so on, are known.

Meanwhile, a semiconductor control device (controller) is equipped so as to increase the ease of signal transmission in the semiconductor apparatus or control the operations of semiconductor devices, and if such a semiconductor control device is not appropriately fixed, the signal transmission efficiency or speed of a semiconductor package may be lowered, the structure of a semiconductor device may become unstable in a multi-stage stack package process, and the preparation yield or reliability of a semiconductor apparatus may be lowered.

Thus, in order to easily bury semiconductor devices in a multi-stage stack package process, various film-shaped or liquid adhesives are being developed.

DETAILED DESCRIPTION OF THE INVENTION

Technical Problem

It is an object of the present invention to provide an adhesive film for semiconductor that can more easily bury a first semiconductor device, which is a semiconductor control device, can prevent the outflow of a fillet around a second semiconductor device after burying to facilitate wire bonding, can minimize the bending of the second semiconductor device to easily and stably construct a multi-stage stack on the second semiconductor device, and can improve the signal transmission efficiency and speed of the finally prepared semiconductor package.

It is another object of the present invention to provide a method for preparing a semiconductor device using the adhesive film for a semiconductor. It is another object of the present invention to provide a semiconductor device including the adhesive film for a semiconductor.

Technical Solution

An adhesive film having a thixotropic index at 110° C. of 1.5 to 7.5, which is used for fixing a first semiconductor device and a second semiconductor device, a ratio of an area of said first semiconductor device to an area of said second semiconductor device being 0.65 or less, is provided herein.

Further, a method for preparing a semiconductor device, including the step of fixing a first semiconductor device and a second semiconductor device using the above-explained adhesive film, the ratio of the area of said first semiconductor device to the area of said second semiconductor device being 0.65 or less, is provided herein.

In addition, a semiconductor device including: a first semiconductor device formed on an adherend; and a second semiconductor device bonded to the first semiconductor device through the above-described adhesive film, wherein the ratio of the area of the first semiconductor device to the area of the second semiconductor device is 0.65 or less, is provided herein.

Hereinafter, an adhesive film, a method for preparing a semiconductor device, and a semiconductor device according to specific embodiments of the invention will be explained in more detail.

According to one embodiment of the invention, an adhesive film having a thixotropic index at 110° C. of 1.5 to 7.5, which is used for fixing a first semiconductor device and a second semiconductor device, the ratio of the area of said first semiconductor device to the area of said second semiconductor device being 0.65 or less, is provided.

The present inventors found that if a first semiconductor device and a second semiconductor device are fixed using an adhesive film having a specific thixotropic index, the ratio of the area of said first semiconductor device to the area of said second semiconductor device being 0.65 or less, the first semiconductor device can be more easily buried, and the bending of the second semiconductor device can be minimized after burying, thus facilitating the construction of a multi-stage stack on the second semiconductor device. Thus, the present inventors confirmed through experiments that the structure of a multi-stage stack package including the first semiconductor device and the second semiconductor device can be more stabilized, thereby improving the signal transmission efficiency and speed of the finally prepared semiconductor package, and completed the present invention.

Specifically, if an adhesive film for a semiconductor having a thixotropic index at 110° C. of 1.5 to 7.5, or 3 to 7, or 4 to 6 is used, in case the adhesive film contacts the first semiconductor device and a shearing force is applied in a bonding process of the second semiconductor device, the flowability of the adhesive film increases to more easily and efficiently bury the first semiconductor device, and after burying, the outflow of a fillet around the second semiconductor device may be prevented, thus facilitating wire bonding while preventing pollution of a semiconductor device.

The term 'burying' means a state wherein the external surface of a semiconductor device is covered or coated with the adhesive film, and thus a part exposed outside does not substantially exist.

By using the adhesive film, in the process of burying or fixing the first semiconductor device and the second semiconductor device, the first semiconductor device can be more easily buried, and after burying, the outflow of a fillet around the semiconductor device can be prevented, thus facilitating wire bonding while preventing the pollution of a semiconductor device, and after burying, the bending of the second semiconductor device can be minimized, thereby facilitating the construction of a multi-stage stack on the second semiconductor device. Thus, the structure of a multi-stage stack package including the first semiconductor device and the second semiconductor device may be more stabilized, thereby improving signal transmission efficiency and speed of the finally prepared semiconductor package, and the multi-stage stack package may become more miniaturized and compact.

The thixotropic index is a ratio of melt viscosity of the adhesive film at a shear rate of 0.5 rad/s and a temperature of 110° C. to melt viscosity of the adhesive film at a shear rate of 5 rad/s and a temperature of 110° C.

As explained above, the thixotropic index at 110° C. of the adhesive film is 1.5 to 7.5, or 3 to 7. If the thixotropic index at 110° C. of the adhesive film is less than 1.5, when a second semiconductor device is fixed using the adhesive film of the embodiment, the adhesive film may flow, and thus the surroundings may be polluted to render wire bonding difficult, and the reliability of semiconductor device preparation may be significantly lowered. Further, if the thixotropic index at 110° C. of the adhesive film is greater than 7.5, at the time of die bonding using the adhesive film of the embodiment, the initial viscosity may significantly increase and thus it may be difficult to bury the first semiconductor device, and after die bonding, the bending of the second semiconductor device may be generated.

The thixotropic index of the adhesive film may be controlled by a method of adjusting or modifying the main components included in the adhesive film, a method of controlling the contents of the main components of the adhesive film and inorganic fillers that can be selectively included, a method of adding a rheology modifier at the time of preparing the adhesive film, and so on.

Meanwhile, the adhesive film may have a melt viscosity of 500 to 10,000 Pa·s at a temperature of 110° C. and a shear rate of 5 rad/s. If the melt viscosity of the adhesive film at a high temperature is too low, in the process of die bonding the first semiconductor device and the second semiconductor device using the adhesive film, the adhesive may outflow to the edge of the semiconductor device (fillet formation). And, if the melt viscosity of the adhesive film at a high temperature is too high, flowability may be lowered and it may become difficult to fix or bury the first semiconductor device and the second semiconductor device, or the bending of the second semiconductor device may become severe and thus additional multi-stage stacking may become difficult.

As explained above, the adhesive film may be used for fixing a first semiconductor device and a second semiconductor device, wherein the ratio of the area of said first semiconductor device to the area of said second semiconductor device is 0.65 or less, or 0.1 to 0.65.

If the ratio of the area of said first semiconductor device to the area of said second semiconductor device is greater than 0.65, since the buried area may increase, and the absolute amount of the adhesive layer that can fill the edge part of the buried first semiconductor device is insufficient, it may become difficult to bury the first semiconductor device using the adhesive film, and the amount of voids that can be trapped inside may increase.

The first semiconductor device and the second semiconductor device may respectively have a thickness of 10 μm to 500 μm.

The adhesive film may have a thickness of 1 μm to 200 μm, or 10 μm to 180 μm. If the thickness of the adhesive film becomes too thin, it may not be sufficient for molding of a device or it may be difficult to sufficiently secure the mechanical properties. And, if the thickness of the second adhesive film is too thick, in the process of fixing the first semiconductor device and the second semiconductor device or other semiconductor preparation processes, it may be difficult to handle or efficiency may be lowered.

The adhesive film may include a thermoplastic resin having a glass transition temperature of −10° C. to 30° C., an epoxy resin, and a curing agent including a phenol resin.

Although the examples of the thermoplastic resin are not limited, for example, polyimide, polyether imide, polyester imide, polyamide, polyether sulfone, polyether ketone, polyolefin, polyvinyl chloride, phenoxy, reactive butadiene acrylonitrile copolymer rubber, (meth)acrylate-based resin, mixtures of two or more kinds thereof, or copolymers of two or more kinds thereof, may be mentioned.

The thermoplastic resin may include a (meth)acrylate-based resin including (meth)acrylate-based repeat units including epoxy-based functional groups.

Specifically, the (meth)acrylate-based resin may be (meth)acrylate-based resin including (meth)acrylate-based repeat units including epoxy-based functional groups, and having a glass transition temperature of −10° C. to 30° C.

The (meth)acrylate-based resin may include 0.1 wt % to 25 wt % of (meth)acrylate-based repeat units including epoxy-based functional groups. The epoxy resin may include a solid epoxy resin and a liquid epoxy resin.

The epoxy resin may have an average epoxy equivalent weight of 100 to 1000.

Meanwhile, it is more preferable in terms of realization of the above-explained properties of the adhesive film to use a solid epoxy resin and a liquid epoxy resin together as the epoxy resin.

By using the solid epoxy resin and the liquid epoxy resin together, the cure degree of the adhesive film may be easily controlled thus increasing the adhesion performance, and the thixotropic index at 110° C. of the adhesive layer may be controlled to 1.5 to 7.5.

Further, by using the solid epoxy resin and the liquid epoxy resin together, the adhesive film may have appropriate flowability, and for example, the adhesive film may have a melt viscosity of 500 to 10,000 Pa·s at a temperature of 110° C. and a shear rate of 5 rad/s.

The liquid epoxy resin may form a substrate (or matrix) of the adhesion component together with the thermoplastic resin having a glass transition temperature of −10° C. to 30° C. and the curing agent including phenol resin, and it gives excellent adhesion and flow properties optimized for a semiconductor to the adhesive film while having relatively low viscosity, and also gives high breaking strength and low breaking elongation.

The phenol resin may have a softening point of 50° C. or more, or 60° C. to 160° C.

As explained above, by using the phenol resin having a softening point of 50° C. or more, it may form a substrate (or matrix) of the adhesion component together with the liquid epoxy resin and the thermoplastic resin having a glass transition temperature of −10° C. to 30° C., and it may give higher tensile modulus and excellent adhesion at room temperature, and flow properties optimized for a semiconductor to the adhesive film.

Although the specific kinds and properties of the liquid epoxy resin are not significantly limited, for example, the liquid epoxy resin may have a viscosity of 500 mPa·s to 20,000 mPa·s at 25° C. The liquid epoxy resin may have an epoxy equivalent weight of 100 to 1000.

Particularly, in the adhesive film, the weight ratio of the liquid epoxy resin to the phenol resin may be 0.3 to 1.5.

If the weight ratio of the liquid epoxy resin to the phenol resin is too high, the melt viscosity of the adhesive film may decrease thus having a sticking property at room temperature, and a tensile modulus at room temperature may decrease and elongation at room temperature may largely increase, thus generating re-adhesion of the adhesive film at the time of wafer dicing. If the weight ratio of the liquid epoxy resin to the phenol resin is too low, a modulus generated at the time of elongation at room temperature may become too high, or elongation at room temperature may be largely lowered, thus significantly lowering the preparation yield of the final product, and the adhesive film may not have a sufficient adhering force to a wafer, thus generating debonding between the wafer and the adhesive film in the preparation process.

The epoxy resin may include one or more kinds selected from the group consisting of biphenyl-based epoxy resin, bisphenol A epoxy resin, bisphenol F epoxy resin, cresol novolac epoxy resin, phenol novolac epoxy resin, tetrafunctional epoxy resin, a triphenylmethane-type epoxy resin, an alkyl modified triphenylmethane-type epoxy resin, a naphthalene-type epoxy resin, a dicyclopentadiene-type epoxy resin, and a dicyclopentadiene modified phenol-type epoxy resin.

The curing agent may further include one or more compounds selected from the group consisting of an amine-based curing agent and an acid anhydride curing agent.

The resin composition for semiconductor adhesion may further include a curing catalyst.

The curing catalyst performs a function of the curing agent or a function for facilitating the curing of the resin composition for semiconductor adhesion, and curing catalysts known to be used in the preparation of semiconductor adhesive film, and so on, may be used without specific limitations. For example, as the curing catalyst, one or more selected from the group consisting of phosphorus-based compounds, boron-based compounds, phosphorus-boron-based compounds, and imidazole-based compounds may be used.

As explained above, the thixotropic index of the adhesive film may also be controlled by adding a rheology modifier when preparing the adhesive film. By using the rheology modifier, when a shearing force is not applied, even if a chemical bond is not formed, a network structure may be formed to maintain the shape, and when a shearing force is applied, the network structure may collapse. Thus, in case a shearing force is not applied before or after die bonding, the adhesive film may maintain the shape without flowing, and in case a shearing force is applied to the adhesive resin at the time of die bonding, flowability may increase to give the properties and performance favorable for burying.

Specifically, the adhesive film may further include one or more selected from the group consisting of an inorganic filler and a rheology modifier.

The kind of inorganic fillers that can be included in the adhesive film are not specifically limited, and common organic fillers or inorganic fillers may be used, and preferably, inorganic fillers may be used. As specific examples of the inorganic fillers, silica having a diameter of 100 nm or more (for example, precipitated silica having a diameter of 100 nm or more), alumina, barium sulfate, and so on, may be used, and an ion adsorbent that can adsorb ionic impurities to improve reliability may also be used as the inorganic filler. Such an ion adsorbent is not specifically limited, and a magnesium-based ion adsorbent such as magnesium hydroxide, magnesium carbonate, magnesium silicate, and magnesium oxide, a calcium-based ion adsorbent such as calcium silicate, calcium carbonate, and calcium oxide, an aluminum-based ion adsorbent such as alumina, aluminum hydroxide, aluminum nitride, and aluminum borate whiskers, a zirconium-based ion adsorbent, and antimony and bismuth-based ion adsorbents may be used, and two or more kinds thereof may be used in combination.

As the rheology modifier that can be included in the adhesive film, components known in the related technical fields may be used, and for example, synthetic powder silica-based compounds such as silica having a diameter of less than 100 nm, (for example, fumed silica having a diameter of less than 100 nm), bentonite-based compounds, micro-settleable calcium carbonate, organic bentonite-based compounds, surface-treated calcium carbonate compounds, metal soap-based compounds, hydrogenated castor oil, polyamide wax, polyethylene oxide compounds, vegetable oil, polymerized oil, polymerized linseed oil, fatty acid dimers, or mixtures of two or more kinds thereof may be used.

More specific examples of such rheology modifiers may include a trade name "CAB-O-SIL" from Cabot Corp. of Boston, Mass., USA, or trade name "AEROSIL" from Evonik Industries of Essen, Germany, and so on. If the adhesive film includes an inorganic filler, it may include the inorganic filler in an optimum content considering the thixotropic index, flowability, and buriability of the adhesive film, and for example, the adhesive film may include 10 to 50 wt % of the inorganic filler. However, if the content of the inorganic filler is excessive in the adhesive film, the adhesive film may be easily broken at room temperature, and the property of adhesion to a wafer at the time of wafer lamination may be lowered.

Further, if the adhesive film includes a rheology modifier, it may include the rheology modifier in an optimum content considering the thixotropic index, flowability, and buriability of the adhesive film, and for example, the adhesive film may include 0.1 to 15 wt % of the rheology modifier. However, if the content of the rheology modifier is excessive in the adhesive film, a micro-dispersion state may be generated when preparing a coating solution, and the viscosity of the adhesive film may rapidly increase to largely decrease buriability.

If the adhesive film includes the inorganic filler and the rheology modifier together, the sum of the weights of the inorganic filler and the rheology modifier may be 5 to 50 wt % in the adhesive film.

Meanwhile, according to another embodiment of the invention, a method for preparing a semiconductor device, including the step of fixing a first semiconductor device and a second semiconductor device using the above-explained adhesive film, the ratio of the area of said first semiconductor device to the area of said second semiconductor device being 0.65 or less, is provided.

The fixing may be conducted through a step of applying a pressure of 0.01 to 1.0 MPa at a temperature of 50° C. to 200° C. while positioning the adhesive film between the first semiconductor device and the second semiconductor device.

Meanwhile, the method of preparing a semiconductor device may further include a step of fixing the first semiconductor device on an adherend through a wire bonding or flip chip method.

The details of the step of fixing the first semiconductor device on an adherend through a wire bonding or flip chip method are as follows.

A material for bonding the first semiconductor device may include a substrate or a lead frame, other semiconductor devices, and so on. As the substrate, previously known substrates such as a printed circuit board and so on may be used. As the lead frame, a metal lead frame such as a Cu lead frame, a 42 Alloy lead frame, and so on, or an organic substrate including glass epoxy, BT (bismaleimide-triazine), polyimide, and so on, may be used. However, the material for bonding the first semiconductor device is not limited thereto, and any circuit boards that can be used by mounting a semiconductor device thereon to electrically connect with the semiconductor device may be used without specific limitations.

As the first adhesive film, the existing die bonding film with a thickness of 5 µm to 50 µm may be used. First, the first adhesive film is attached to a first semiconductor device, which is die-bonded onto an adherend. Thereafter, the first adhesive film in a semi-cured state is heated under predetermined conditions, thereby thermally curing the first adhesive film and fixing the first semiconductor device onto the adherend. The heat treatment is preferably conducted at a temperature of 50 to 200° C. and a pressure of 0.01 to 1.0 MPa, and more preferably at a temperature of 90° C. to 180° C. and a pressure of 0.1 to 0.8 MPa. The heat treatment is preferably conducted for 0.1 to 10 hours, and more preferably 0.5 to 7 hours.

A first wire bonding process is a process of electrically connecting the front end of the terminal part of an adherend with the electrode pad on the first semiconductor device by a bonding wire. As the bonding wire, for example, a gold wire, an aluminum wire, a copper wire, and so on, are used. The temperature of the wire bonding may be 70 to 240° C., preferably 80 to 220° C.

Heating is conducted for a few seconds to a few minutes. The wiring is connected by the combined use of vibration energy generated by ultrasonic waves and pressure energy generated by applied pressure, while heated to the above temperature range.

As the process of burying the first semiconductor device, a second adhesive film, which is an adhesive film for burying, is attached to the second semiconductor device, and is die bonded onto the first semiconductor device. In this process, the second adhesive film molds the first semiconductor device, and simultaneously contacts with the adherend at the principal plane part of the first semiconductor device. The thickness of the second adhesive film is appropriately 1 µm to 200 µm, and more preferably 10 µm to 180 µm. If the thickness of the second adhesive film is too thin, it may not be sufficient for molding of a device or it may be difficult to sufficiently secure the mechanical properties. Further, if the thickness of the second adhesive film is too thick, it may be difficult to handle in the process of fixing the first semiconductor device and the second semiconductor device or the efficiency may be lowered.

The heat treatment is preferably conducted at a temperature of 50 to 200° C. and a pressure of 0.01 to 1.0 MPa, and more preferably at a temperature of 90° C. to 180° C. and a pressure of 0.1 to 0.8 MPa. The heat treatment is preferably conducted for 0.1 to 10 hours, and more preferably 0.5 to 7 hours.

A second wire bonding process is a process of electrically connecting the front end of the terminal part of the adherend with the electrode pad on the second semiconductor device by a bonding wire. As the bonding wire, for example, a gold wire, an aluminum wire, a copper wire, and so on, are used. The temperature of the wire bonding may be 70 to 240° C., preferably 80 to 220° C. Heating is conducted for a few seconds to a few minutes. The wiring is connected by the combined use of vibration energy generated by ultrasonic waves and pressure energy generated by applied pressure, while heated to the above temperature range.

In the third fixing process, a third semiconductor device that is identical to or different from the second semiconductor device is fixed on the second semiconductor device. A third adhesive film is attached to the third semiconductor device, which is die bonded onto the second semiconductor device, thereby fixing it. As the third adhesive film, the same one as the first adhesive film in the first fixing process may be appropriately used. Since the third adhesive film is not required to bury other semiconductor devices, it may be used with a thin thickness of about 3 µm to 60 µm. Thereafter, stacking may be progressed by a common process of manufacturing a package, thus stacking as many layers as required and wire bonding. After stacking a desired number of semiconductor devices, a sealing process for resin-sealing the whole semiconductor device may be conducted.

The sealing process is a process of sealing a semiconductor device with a sealing resin. Such a sealing process is conducted so as to protect a semiconductor device or a bonding wire mounted on an adherend, and for example, it is conducted by molding the sealing resin with a mold. As the sealing resin, for example, an epoxy-based resin is used. At the time of resin-sealing, heating is commonly conducted at 175° C. for 60 to 90 seconds, but curing may be conducted at 165 to 185° C. for a few minutes, for example. In this process, pressurization may be carried out at the time of resin-sealing. In this case, the pressure for pressurization is preferably 1 to 15 MPa, more preferably 3 to 10 MPa.

After the sealing process, a post-curing process for post-curing the sealing resin may be conducted. In the sealing process, a sealing resin that has not been sufficiently cured may be completely cured. Although the heating temperature in the sealing process differs according to the kind of sealing resin, for example, it is within a range of 165 to 185° C., and the heating time is about 0.5 to 8 hours. By going through the sealing process or post-curing process, a semiconductor package may be manufactured.

A semiconductor device may be prepared by applying a flip chip as another first semiconductor device, which is progressed by the same method except for the fixing process of the first semiconductor device for wire bonding. In case the flip chip is applied, the first semiconductor device is fixed on an adherend by flip-chip connection, and is so-called face-down mounted with the circuit side of the first semiconductor device being opposed to the adherend. In the first semiconductor device, plural projection electrodes such as a bump and so on are installed, and the projection electrodes are connected with the electrode on the adherend. An underfill material is filled between the adherend and the first semiconductor device.

The connection method is not specifically limited, and a previously known flip chip bonder may be used for connection. For example, while contacting the projection electrodes such as bumps and so on, which are formed on the first semiconductor device, with a conductive material (solder) for a joint that is adhered to the connection pad of the adherend, and pressurizing, the conductive material is melted, thereby securing electrical connection of the first semiconductor device and the adherend, thus fixing the first semiconductor device on the adherend (flip-chip bonding).

In general, at the time of flip-chip connection, the heating condition is 240 to 300° C., and the pressurization condition is 0.5 to 490 N.

The material for forming bumps as the projection electrodes is not specifically limited, and for example, solders (alloys) such as a tin-lead-based metal material, a tin-silver-based metal material, a tin-silver-copper-based metal material, a tin-zinc-based metal material, a tin-zinc-bismuth-based metal material, and so on, or a gold-based metal material, a copper-based metal material, and so on, may be used. As the underfill material, a previously known liquid or film-shaped underfill material may be used.

As the process of burying the first semiconductor device, the second adhesive film, which is an adhesive film for burying, is attached to the second semiconductor device, and die-bonded onto the first semiconductor device. In this process, the second adhesive film molds the first semiconductor device, and simultaneously contacts with the adherend at the principal plane part of the first semiconductor device. Since the first semiconductor device is a flip-chip device and does not have a bonding wire, the thickness of the second adhesive film required for molding may become low, and thus the thickness of the second adhesive film is appropriately 1 μm to 200 μm, and more preferably 10 μm to 180 μm. If the thickness of the second adhesive film is low, it may not be sufficient for molding of a device, and if it is too thick, processability may be deteriorated. After stacking the second semiconductor device, heat treatment is progressed to fix the second semiconductor device so as to not move in the subsequent wire bonding.

The heat treatment is preferably conducted at a temperature of 50 to 200° C. and a pressure of 0.01 to 1.0 MPa, and more preferably, at a temperature of 90° C. to 180° C. and a pressure of 0.1 to 0.8 MPa. The heat treatment is preferably conducted for 0.1 to 10 hours, and more preferably 0.5 to 7 hours.

A second wire bonding process is a process of electrically connecting the front end of the terminal part of the adherend with the electrode pad on the second semiconductor device by a bonding wire. As the bonding wire, for example, a gold wire, an aluminum wire, a copper wire, and so on, are used. The temperature of the wire bonding may be 70 to 240° C., and preferably 80 to 220° C. Heating is conducted for a few seconds to a few minutes. The wiring is connected by the combined use of vibration energy generated by ultrasonic waves and pressure energy generated by applied pressure, while heated to the above temperature range.

Meanwhile, in the third fixing process, a third semiconductor device that is identical to or different from the second semiconductor device is fixed on the second semiconductor device. A third adhesive film is attached to the third semiconductor device, which is die bonded onto the second semiconductor device, thereby fixing it. As the third adhesive film, the same one as the first adhesive film in the first fixing process may be appropriately used. Since the third adhesive film is not required to bury other semiconductor devices, it may be used with a thin thickness of about 3 μm to 60 μm. Thereafter, stacking may be progressed by a common process of manufacturing a package, thus stacking as many layers as required and wire bonding. After stacking a desired number of semiconductor devices, a sealing process for resin-sealing the whole semiconductor device may be conducted.

The sealing process is a process of sealing a semiconductor device with a sealing resin, and is conducted so as to protect a semiconductor device or a bonding wire mounted on an adherend. The sealing process is carried out by molding sealing resin with a mold, for example. As the sealing resin, for example, an epoxy-based resin is used. At the time of resin-sealing, heating is commonly conducted at 175° C. for 60 to 90 seconds, but curing may be conducted at 165 to 185° C. for a few minutes, for example.

In the sealing process, pressurization may be carried out at the time of resin-sealing. In this case, the pressure for pressurization is preferably 1 to 15 MPa, and more preferably 3 to 10 MPa.

After the sealing process, a post-curing process for post-curing the sealing resin may be conducted. In the post-curing process, a sealing resin that has not been sufficiently cured in the sealing process is completely cured. Although the heating temperature in the post-curing process differs according to the kind of sealing resin, for example, it is within a range of 165 to 185° C., and the heating time is about 0.5 to 8 hours. By going through the sealing process or post-curing process, a semiconductor package may be manufactured.

According to still another embodiment of the invention, a semiconductor device including a first semiconductor device formed on an adherend, and a second semiconductor device bonded to the first semiconductor device through the above-explained adhesive film, wherein the ratio of the area of the first semiconductor device to the area of the second semiconductor device is 0.65 or less, is provided.

The adhesive film may bury the first semiconductor device.

The first semiconductor device may be combined to the adherend through a wire bonding or flip-chip method.

Advantageous Effects

According to the present invention, an adhesive film for a semiconductor that can more easily bury a first semiconductor device, which is a semiconductor control device, can prevent the outflow of a fillet around a second semiconductor device after burying to facilitate wire bonding, can minimize the bending of the second semiconductor device to easily and stably construct a multi-stage stack on the second semiconductor device, and can improve the signal transmission efficiency and speed of the finally prepared semiconductor package, a method for preparing a semiconductor using the adhesive film for a semiconductor, and a semiconductor device including the adhesive film for a semiconductor, are provided.

By using the adhesive film for a semiconductor, a semiconductor control device can be more easily buried in a multi-stack semiconductor package, the signal transmission efficiency and speed of the finally prepared semiconductor package can be improved, and the structure of the multi-stage stack package including a first semiconductor device and a second semiconductor device can be more stably maintained.

DETAILED DESCRIPTION OF THE EMBODIMENTS

Embodiments of the invention will be explained in more detail by way of the following examples. However, these examples are provided only for illustration of the invention, and should not be construed as limiting the invention.

Preparation Example: Preparation of Thermoplastic Acrylate Resin 100 g of toluene was mixed with 40 g of butyl acrylate, 60 g of ethyl acrylate, 15 g of acrylonitrile, and 10 g of glycidyl methacrylate, and the mixture was reacted at 80° C. for about 12 hours to synthesize an acrylate-based resin in which glycidyl groups are introduced as branched chains (weight average molecular weight of about 700,000, glass transition temperature of 10° C.).

Examples 1 to 5 and Comparative Examples 1 to 3: Preparation of Adhesive Resin Compositions for Semiconductor and Adhesive Film for Semiconductor Example 1

(1) Preparation of a Solution of an Adhesive Resin Composition for Semiconductor 50 g of phenol resin KH-6021 (produced by DIC Corporation, bisphenol A novolac resin, hydroxyl equivalent weight 121 g/eq, softening point: 133° C.), which is a curing agent for epoxy resin, 38 g of epoxy resin EOCN-104S (produced by Nippon Kayaku Co., Ltd., cresol novolac type of epoxy resin, epoxy equivalent weight 214 g/eq, softening point: 92° C.), 50 g of liquid epoxy resin RE-310S (produced by Nippon Kayaku Co., Ltd., bisphenol A epoxy resin, epoxy equivalent weight 180 g/eq), 40 g of thermoplastic acrylate resin obtained in Preparation Example 1, 5 g of silane coupling agent A-187 (GE Toshiba Silicone, gamma-glycidoxypropyltrimethoxysilane), 0.1 g of a curing accelerator 2PZ (Shikoku Chemicals Corporation, 2-phenyl imidazole), and 100 g of filler SC-2050 (Admatec Corporation, spherical silica, mean particle diameter about 400 nm) were mixed in a methyl ethyl ketone solvent to obtain a solution of an adhesive composition for a semiconductor (solid content 40 wt %).

(2) Preparation of an Adhesive Film for Semiconductor

The above prepared solution of an adhesive composition for a semiconductor was coated on a release-treated polyethylene terephthalate film (thickness 38 μm), and then dried at 110° C. for 3 minutes to obtain an adhesive film for a semiconductor with a thickness of about 110 μm.

(3) Preparation of a Semiconductor Device

An adhesive film with the composition of Example 1 was manufactured with a thickness of 20 μm, and used as the adhesive film of a first semiconductor device. It was attached to a tetragonal first semiconductor device with a thickness being 50 μm, and the length of one side being 4 mm, under the condition of 70° C. The first semiconductor device to which the adhesive film is attached was adhered to a BGA substrate. At this time, the conditions were a temperature of 125° C. and a pressure of 1 kg for 1 second. The BGA substrate to which the first semiconductor device was attached was heated with a drier to 125° C. for 1 hour, thus heat curing the adhesive film. Subsequently, using a wire bonder (Shinkawa Co., Ltd., product name ⌈UTC-1000⌋), wire bonding of the current 23 μm wire to a controller chip was progressed with a 100 μm pitch under the condition of 150° C.

Subsequently, each adhesive film manufactured in the examples and comparative examples was attached to a tetragonal semiconductor chip with the length of one side being 8.8 mm and the thickness being 80 μm, under the condition of a temperature of 70° C. The second semiconductor device to which the adhesive film was attached was attached to the first semiconductor device and BGA substrate, thus burying the first semiconductor device. At this time, the conditions were a temperature of 110° C. and a pressure of 2 kg for 1 second.

Examples 2 to 5

Solutions of adhesive resin compositions for a semiconductor (solid content 40 wt %) and adhesive films for a semiconductor with a thickness of 110 μm were obtained by the same method as Example 1, except applying the components and the amounts described in the following Table 1.

Comparative Examples 1 and 2

Solutions of adhesive resin compositions for a semiconductor (solid content 40 wt %) and adhesive films for a semiconductor with a thickness of 110 μm were obtained by the same method as Example 1, except applying the components and the amounts described in the following Table 1.

Comparative Example 3

Solutions of adhesive resin compositions for a semiconductor (solid content 40 wt %) and adhesive films for a semiconductor with a thickness of 110 μm were obtained by the same method as Example 1, applying the components and the amounts of Example 1, except that a tetragonal first semiconductor device with the length of one side being 7.5 mm and the thickness being 50 μm was used.

TABLE 1

Compositions of the resin compositions of examples and comparative examples [unit: g]

| | | Example 1 | Example 2 | Example 3 | Example 4 | Example 5 | Comparative Example1 | Comparative Example2 | Comparative Example3 |
|---|---|---|---|---|---|---|---|---|---|
| Phenol resin | KH-6021 | 40 | | | 40 | 60 | 40 | 60 | 40 |
| | KPH-3075 | | 40 | | | | | | |
| | GPH-65 | | | 40 | | | | | |
| Epoxy resin | RE-310S | 50 | 50 | 50 | 50 | 80 | 50 | 80 | 50 |
| | EOCN-104S | 38 | 38 | 38 | 38 | 58 | 38 | 58 | 38 |
| Acryl resin | Preparation 1 | 50 | 50 | 50 | 50 | 50 | 50 | 50 | 50 |
| Curing accelerator | 2PZ | 0.1 | 0.1 | 0.1 | 0.1 | 0.1 | 0.1 | 0.1 | 0.1 |
| Coupling agent | A-187 | 5 | 5 | 5 | 5 | 5 | 5 | 5 | 5 |
| Filler | SC-2050 | 100 | 100 | 100 | 100 | 15 | 100 | 15 | 100 |
| Rheology modifier | R-972 | 0 | 0 | 0 | 3 | 10 | 60 | 0 | 0 |
| Size of first semiconductor device | | 4 mm | 4 mm | 4 mm | 4 mm | 4 mm | 4 mm | 4 mm | 7.5 mm |

R-972 (Evonik Industries, fumed silica, average particle diameter 17 nm)
KPH-F3075 (Kolon Chemical Co., Ltd., hydroxyl equivalent weight: 175 g/eq, softening point: 75° C.)
GPH-65 (Nippon Kayaku Co., Ltd., hydroxyl equivalent weight 198 g/eq, softening point: 65° C.)

Experimental Examples: Assessment of the Properties of Adhesive Films for Semiconductor

Experimental Example 1: Measurement of Melt Viscosity

The adhesive films respectively obtained in the examples and comparative examples were stacked to a thickness of 660 μm, and then laminated using a roll laminator at 60° C. Thereafter, each specimen was formed in a circular shape with a diameter of 8 mm, and then melt viscosity according to temperature was measured at a shear rate of 5 rad/s and a temperature rise rate of 20° C./min, using an advanced rheometric expansion system (ARES) of TA Corporation.

Experimental Example 2: Measurement of First Semiconductor Device Molding Property of the Second Adhesive Layer As described in the preparation example of a semiconductor device, a BGA substrate to which a second semiconductor device is adhered was heated with a pressure drier under the conditions of 135° C., 1 hour, and 7 atm, to heat cure the adhesive film, thus manufacturing a semiconductor device. The manufactured semiconductor device was cut, the cut side was observed with an optical microscope (200× magnification), and it was interpreted and assessed as 「○」 if the first semiconductor device was well buried without voids around it, and as 「x」 if any voids were observed around the first semiconductor device.

Experimental Example 3: Measurement of Bonding Wire Molding Property

After manufacturing a semiconductor device as described in Experimental Example 2, it was determined whether or not the bonding wire was damaged, using X-ray inspection equipment. It was interpreted and assessed as good 「○」 if the bonding wires inside the semiconductor device were spaced apart at regular intervals, and as faulty 「x」 if there were any bonding wires overlapping with each other to generate a short.

Experimental Example 4: Measurement of Fillet Amount

After manufacturing a semiconductor device as described in Experimental Example 2, the amount of adhesive having flowed out to the surroundings of the second semiconductor device was measured, the most flowed-out length per device was measured, and it was interpreted and assessed as good 「○」 if the length was within 200 nm, and as faulty 「x」 if the length exceeded 200 μm.

TABLE 2

Results of Experimental Examples

| | Example 1 | Example 2 | Example 3 | Example 4 | Example 5 | Comparative Example 1 | Comparative Example 2 | Comparative Example 3 |
|---|---|---|---|---|---|---|---|---|
| Melt viscosity at 110° C. | 2300 | 2230 | 2010 | 2800 | 3200 | 12300 | 400 | 2300 |
| Thixotropic index at 110° C. | 4.2 | 4.5 | 4.6 | 5.2 | 6.3 | 8 | 1.4 | 4.2 |
| First semiconductor molding property | ○ | ○ | ○ | ○ | ○ | X | ○ | X |
| Bonding wire molding property | ○ | ○ | ○ | ○ | ○ | X | ○ | ○ |
| Filter property | ○ | ○ | ○ | ○ | ○ | ○ | X | X |

As shown in Table 2, it is confirmed that in case the first semiconductor device and the second semiconductor device (the ratio of the area of the first semiconductor device to the area of the second semiconductor device is 0.65 or less) are fixed using the adhesive films for a semiconductor device of Examples 1 to 5 with thixotropic indexes at 110° C. of 1.5 to 7.5, the first semiconductor device, which is a semiconductor control device, can be more easily buried, and after burying, the bending of the second semiconductor device can be minimized, thus facilitating the construction of a multi-stage stack on the second semiconductor device.

In case the adhesive films for a semiconductor device of Examples 1 to 5 are used, flowing of the adhesive at a curing temperature in the second semiconductor chip or flowing-out of the adhesive to the surroundings of the semiconductor device and forming of a fillet can be prevented.

To the contrary, in the adhesive film of Comparative Example 1 with a thixotropic index at 110° C. being greater than 7.5, the performance of burying the first semiconductor device was low and the bonding wires overlap each other to generate a short, and in the adhesive film of Comparative Example 2 with a thixotropic index at 110° C. being less than 1.5, the adhesive excessively flowed out to the surroundings of the second semiconductor device to form a fillet.

In the preparation process of the semiconductor device of Comparative Example 3 wherein the ratio of the area of the first semiconductor device to the area of the second semiconductor device is greater than 0.65, during the process of burying the first semiconductor device, voids are generated or the adhesive excessively flowed out to the surroundings of the second semiconductor device to form a fillet.

The invention claimed is:
1. A semiconductor device comprising:
a first semiconductor device;
a second semiconductor device; and
an adhesive film having a thixotropic index at 110° C. of to 7 for fixing the first semiconductor device and the second semiconductor device, wherein the thixotropic index is a ratio of the melt viscosity of the adhesive film at a shear rate of 0.5 rad/s and a temperature of 110° C. to the melt viscosity of the adhesive film at a shear rate of 5 rad/s and a temperature of 110° C., wherein a ratio of an area of said first semiconductor device to an area of said second semiconductor device is 0.65 or less, wherein the first semiconductor device is buried in the adhesive film, wherein the second semiconductor device is not surrounded by the adhesive film, wherein the adhesive film comprises: a thermoplastic resin having a glass transition temperature of −10° C. to 30° C.; an epoxy resin; and a curing agent comprising a phenol resin, wherein the adhesive film has a melt viscosity of 500 to 10,000 Pa·s at a shear rate of 5 rad/s and a temperature of 110° C., wherein the epoxy resin includes a solid epoxy resin and a liquid epoxy resin, and a weight ratio of the liquid epoxy resin to the phenol resin is 0.3 to 1.5, and wherein the phenol resin has a softening point of 50° C. to 133° C.

2. The semiconductor device of claim 1, wherein the thermoplastic resin includes a (meth)acrylate-based resin comprising (meth)acrylate-based repeat units comprising epoxy-based functional groups.

3. The semiconductor device of claim 2, wherein the (meth)acrylate-based resin comprises 0.1 wt % to 25 wt % of the (meth)acrylate-based repeat units comprising epoxy-based functional groups.

4. The semiconductor device of claim 1, wherein the adhesive film further comprises one or more selected from the group consisting of an inorganic filler and a rheology modifier.

5. The semiconductor device of claim 4, wherein the rheology modifier comprises one or more compounds selected from the group consisting of silica having a diameter of less than 100 μm, bentonite-based compounds, micro-settleable calcium carbonate, organic bentonite-based compounds, surface-treated calcium carbonate compounds, metal soap-based compounds, hydrogenated castor oil, polyamide wax, polyethylene oxide compounds, vegetable oil, polymerized oil, polymerized linseed oil, and fatty acid dimers.

6. The semiconductor device of claim 4, wherein the inorganic filler comprises one or more compounds selected from the group consisting of silica having a diameter of less than 100 μm, alumina, barium sulfate, magnesium hydroxide, magnesium carbonate, magnesium silicate, magnesium oxide, calcium silicate, calcium carbonate, calcium oxide, alumina, aluminum hydroxide, aluminum nitride, aluminum borate whiskers, zirconium-based compounds, and antimony and bismuth-based compounds.

7. The semiconductor device of claim 4, wherein the adhesive film comprises 10 to 50 wt % of the inorganic filler or 0.1 to 15 wt % of the rheology modifier.

8. The semiconductor device of claim 1, wherein the adhesive film has a thickness of 1 μm to 200 μm.

9. The semiconductor device of claim 1, wherein the liquid epoxy resin has a viscosity of 500 mPa·s to 20,000 mPa·s at 25° C.

10. The semiconductor device according to claim 1, wherein the first semiconductor device is bonded to an adherend through a wire bonding or flip chip method.

11. A method for preparing a semiconductor device, comprising a step of fixing a first semiconductor device and a second semiconductor device using an adhesive film having a thixotropic index at 110° C. of to 7, wherein the thixotropic index is a ratio of the melt viscosity of the adhesive film at a shear rate of 0.5 rad/s and a temperature of 110° C. to the melt viscosity of the adhesive film at a shear rate of 5 rad/s and a temperature of 110° C., wherein a ratio of an area of said first semiconductor device to an area of said second semiconductor device is 0.65 or less and wherein the first semiconductor device is buried in the adhesive film, wherein the second semiconductor device is not surrounded by the adhesive film, wherein the adhesive film comprises: a thermoplastic resin having a glass transition temperature of −10° C. to 30° C.; an epoxy resin; and a curing agent comprising a phenol resin, wherein the adhesive film has a melt viscosity of 500 to 10,000 Pa·s at a shear rate of 5 rad/s and a temperature of 110° C., wherein the epoxy resin includes a solid epoxy resin and a liquid epoxy resin, and a weight ratio of the liquid epoxy resin to the phenol resin is 0.3 to 1.5, and wherein the phenol resin has a softening point of 50° C. to 133° C.

12. The method for preparing a semiconductor device according to claim 11, wherein fixing the first semiconductor device and the second semiconductor device is conducted through a step of applying a pressure of 0.01 to 1.0 MPa at a temperature of 50° C. to 200° C., while positioning the adhesive film between the first semiconductor device and the second semiconductor device.

13. The method for preparing a semiconductor device according to claim 11, further comprising a step of fixing the first semiconductor device on an adherend through a wire bonding or flip chip method.

* * * * *